US012132465B2

(12) United States Patent
Segovia-Fernandez et al.

(10) Patent No.: US 12,132,465 B2
(45) Date of Patent: Oct. 29, 2024

(54) TUNABLE BULK ACOUSTIC WAVE (BAW) RESONATOR BASED ON APPLICATION OF RADIO-FREQUENCY (RF) SIGNAL TO BRAGG MIRROR METAL LAYER

(71) Applicant: TEXAS INSTRUMENTS INCORPORATED, Dallas, TX (US)

(72) Inventors: Jeronimo Segovia-Fernandez, San Jose, CA (US); Bichoy Bahr, Allen, TX (US); Ting-Ta Yen, San Jose, CA (US); Michael Henderson Perrott, Nashua, NH (US); Zachary Schaffer, Las Vegas, NV (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 317 days.

(21) Appl. No.: 17/537,776

(22) Filed: Nov. 30, 2021

(65) Prior Publication Data
US 2023/0170877 A1  Jun. 1, 2023

(51) Int. Cl.
H03H 9/17 (2006.01)
H03H 9/02 (2006.01)
H03H 9/13 (2006.01)

(52) U.S. Cl.
CPC ........ *H03H 9/175* (2013.01); *H03H 9/02015* (2013.01); *H03H 9/131* (2013.01)

(58) Field of Classification Search
CPC ..... H03H 9/175; H03H 9/02015; H03H 9/131
See application file for complete search history.

(56) References Cited

U.S. PATENT DOCUMENTS

| 6,534,900 | B2* | 3/2003 | Aigner | H03H 9/175 |
| | | | | 310/326 |
| 8,531,083 | B2* | 9/2013 | Sinha | H03H 9/589 |
| | | | | 310/326 |
| 11,063,558 | B2* | 7/2021 | Bahr | H03B 5/326 |
| 2011/0316649 | A1* | 12/2011 | Link | H03H 9/02157 |
| | | | | 333/133 |
| 2020/0274514 | A1* | 8/2020 | Yen | H03H 9/175 |

* cited by examiner

Primary Examiner — Samuel S Outten
(74) Attorney, Agent, or Firm — John R. Pessetto; Frank D. Cimino

(57) ABSTRACT

A tunable bulk acoustic wave (BAW) resonator includes: a first electrode adapted to be coupled to an oscillator circuit; a second electrode adapted to be coupled to the oscillator circuit; and a piezoelectric layer between the first electrode and the second electrode; and a Bragg mirror. The Bragg mirror has: a metal layer; and a dielectric layer between the metal layer and either of the first electrode or the second electrode. The tunable BAW resonator also includes: a radio-frequency (RF) signal source having a first end and a second end, the first end coupled to the first electrode, and the second end coupled to the second electrode; and an amplifier circuit between either the first electrode or the second electrode and the Bragg mirror metal layer.

20 Claims, 10 Drawing Sheets

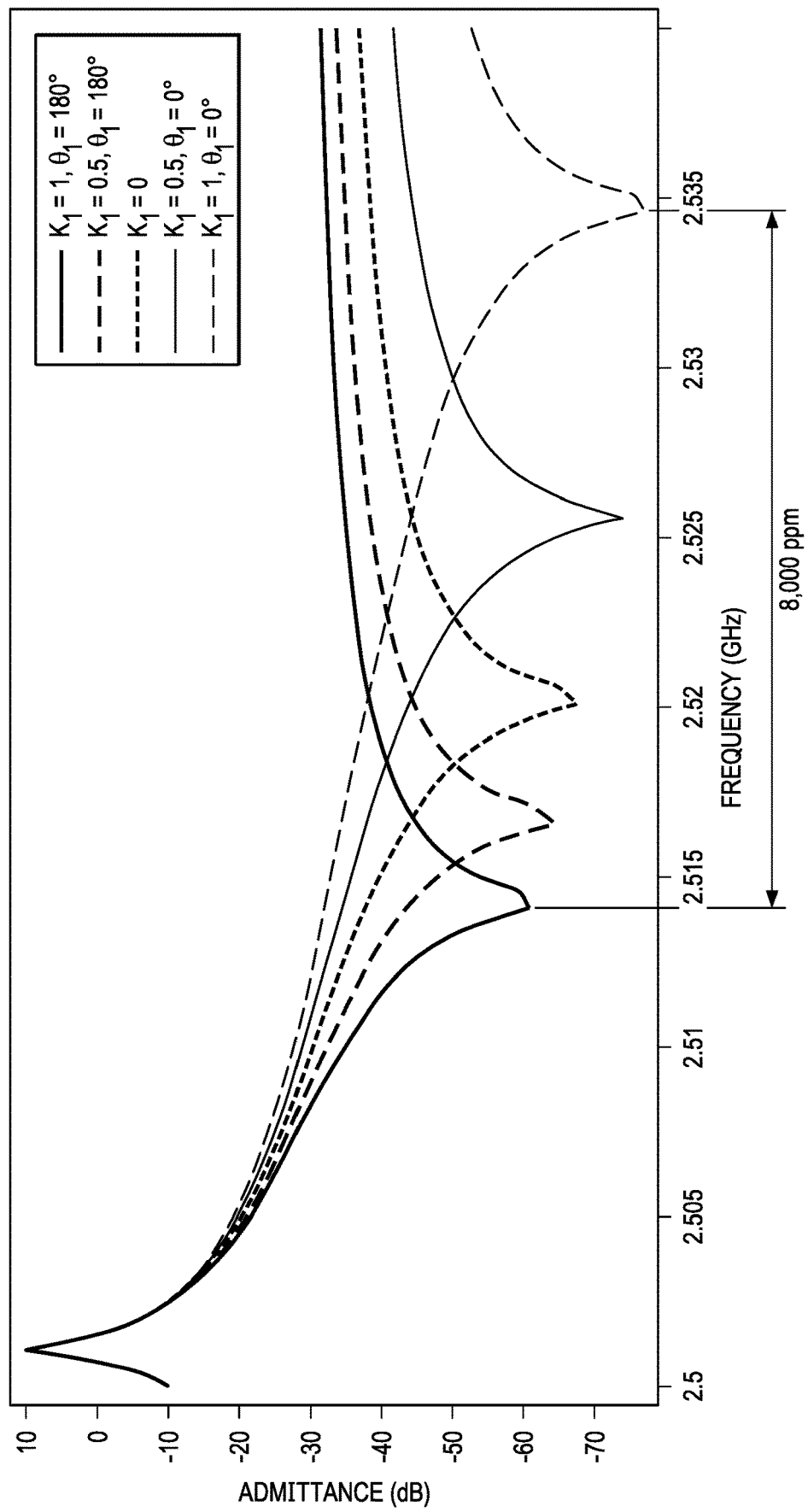

TUNABLE BULK ACOUSTIC WAVE (BAW) RESONATOR BASED ON APPLICATION OF RADIO-FREQUENCY (RF) SIGNAL TO BRAGG MIRROR METAL LAYER

BACKGROUND

As new microelectromechanical systems (MEMS) are developed and complementary metal-oxide semiconductor (CMOS) technology advances, new integrated circuit (IC) products combining MEMS and CMOS are commercialized. One example IC product is a MEMS-based oscillator, which may be used to provide frequency modulation and timing in a variety of modern electronic systems ranging from mobile phones and radio transmitters to more complex timing devices for computers and navigational aids.

Quartz crystal tuned oscillators (XOs) have good relative frequency accuracy, low frequency drift (or shift) as a function of temperature, and low noise. However, while the density of electronics has grown exponentially following Moore's law, the area and volume occupied by quartz crystals has not scaled accordingly. To address the scaling issue of XOs, efforts have been directed toward replacing the XOs with MEMS-based oscillators. MEMS resonators are the building block of MEMS-based oscillators and their function is to set the oscillation frequency. A BAW resonator is an example of a MEMS resonator.

BAW resonators use a piezoelectric effect to convert electrical energy into mechanical energy resulting from an applied RF voltage and vice versa. A BAW resonator generally operates at its mechanical resonant frequency, which is defined as a frequency for which the half wavelength of sound waves propagating in the device is equal to a total piezoelectric layer thickness for a given velocity of sound for the material. BAW resonators operating in the GHz range generally have physical dimensions of tens of microns in diameter, with thicknesses of a few microns.

Although BAW resonators offer potential as a frequency reference, frequency tuning of a BAW resonator has been difficult to address. One suggested solution involves adding a capacitor across the BAW resonator, but that solution reduces quality factor and increases power consumption.

SUMMARY

In one example embodiment, a tunable bulk-acoustic wave (BAW) resonator comprises: a first electrode adapted to be coupled to an oscillator circuit; a second electrode adapted to be coupled to the oscillator circuit; and a piezoelectric layer between the first electrode and the second electrode; and a Bragg mirror. The Bragg mirror has: a metal layer; and a dielectric layer between the metal layer and either of the first electrode or the second electrode. The tunable BAW resonator also comprises: a radio-frequency (RF) signal source having a first end and a second end, the first end coupled to the first electrode, and the second end coupled to the second electrode; and an amplifier circuit between the Bragg mirror metal layer and either the first electrode or the second electrode.

In another example embodiment, a system comprises a tunable BAW resonator having: a first electrode; a second electrode; and a piezoelectric layer between the first electrode and the second electrode. The system also comprises a Bragg mirror having: a metal layer; and a dielectric layer between the metal layer and either the first electrode or the second electrode. The system further comprises an oscillator core coupled to the first electrode and the second electrode. The tunable BAW resonator is configured to apply an RF signal to the metal layer of the Bragg mirror.

In yet another example embodiment, an integrated circuit comprises a bulk acoustic wave (BAW) resonator core, the BAW resonator core having a first electrode, a second electrode, and a piezoelectric layer between the first electrode and the second electrode. The integrated circuit also comprises: a Bragg mirror adjacent to the BAW resonator core, the Bragg mirror having a metal layer; a radio-frequency (RF) signal source configured to apply an RF signal to the metal layer of the Bragg mirror; and an amplifier circuit between the RF signal source and the metal layer and configured to modify the RF signal.

BRIEF DESCRIPTION OF THE DRAWINGS

FIG. 4A is a graph of admittance as a function of frequency for different amplifier gain and phase shift values related to a tunable BAW resonator in accordance with various example embodiments.

DETAILED DESCRIPTION

Figure 1:
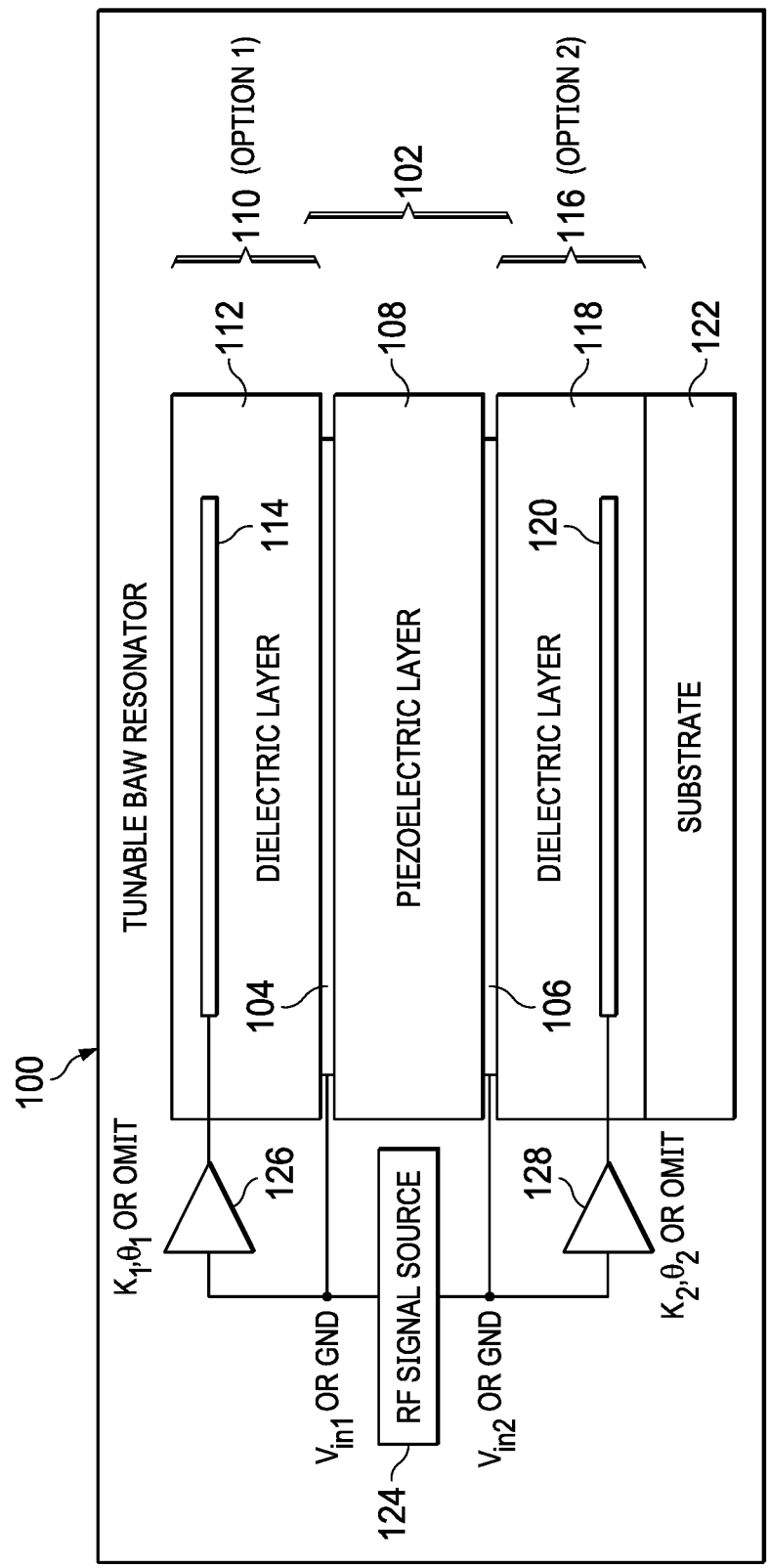
FIG. 1 is a block diagram of a tunable bulk acoustic wave (BAW) resonator in accordance with an example embodiment.

Some example embodiments include a tunable bulk-acoustic wave (BAW) resonator. The behavior of the tunable BAW resonator is modeled as an LRC (inductor-resistor-capacitor) circuit having series components and parallel components, resulting in a parallel resonance frequency, a series resonance frequency, a parallel Q factor, and a series Q factor. In some example embodiments, the tunable BAW resonator is configured to adjust its parallel resonance frequency and/or its parallel Q factor based on application of a radio-frequency (RF) signal to a metal layer of a Bragg mirror.

In some example embodiments, a tunable BAW resonator includes a BAW resonator core having a first electrode, a second electrode, and a piezoelectric layer between the first electrode and the second electrode. The Bragg mirror is adjacent to the BAW resonator core and includes the metal layer as well as a dielectric layer between the metal layer and either the first electrode or the second electrode. In some example embodiments, a tunable BAW resonator includes a first Bragg mirror and a second Bragg mirror. In such examples, the first Bragg mirror includes a first metal layer and a first dielectric layer between the first metal layer and the first electrode of the BAW resonator core. The second Bragg mirror includes a second metal layer and a second dielectric layer between the second metal layer and the second electrode of the BAW resonator core. Based on a first Bragg mirror and/or a second Bragg mirror, a tunable BAW resonator is configured to adjust its parallel resonance frequency and/or its parallel Q factor based on providing and possibly modifying: a first RF signal applied to the first metal layer of the first Bragg mirror; and/or a second RF signal applied to the second metal layer of the second Bragg mirror.

In some example embodiments, a tunable BAW resonator includes an RF signal source coupled to the first and second electrodes. The tunable BAW resonator also includes an amplifier circuit between the RF signal source and the metal layer of a Bragg mirror. As an option, the amplifier circuit modifies the RF signal applied to the metal layer of a Bragg mirror by adjusting the amplifier gain, which results in the parallel resonance frequency of the tunable BAW resonator being adjusted up or down. As another option, the amplifier circuit modifies the RF signal applied to the metal layer of a Bragg mirror by adjusting a phase shift applied by the amplifier circuit to the RF signal. Such phase shift modification to the RF signal results in a change to the parallel Q factor of the tunable BAW resonator. If a first Bragg mirror and a second Bragg mirror are included, a tunable BAW resonator may be configured to adjust its parallel resonance frequency and/or its parallel Q factor based on providing and possibly modifying: a first RF signal applied to the first metal layer of the first Bragg mirror via a first amplifier circuit; and/or a second RF signal applied to the second metal layer of the second Bragg mirror via a second amplifier circuit. In different example embodiments, the RF signal modification performed by each amplifier circuit may be fixed or adjustable. Without limitation, each amplifier circuit may include a voltage-controlled voltage source (VCVS) to enable modifications to the RF signal applied to a Bragg mirror metal layer.

In some example embodiments, the tunable BAW resonator, including the BAW resonator core, each Bragg mirror, and each amplifier circuit is fabricated as an integrated circuit (IC). The tunable BAW resonator may be combined with other circuitry (e.g., part of the same IC or other ICs), such as timing circuitry (e.g., oscillator circuitry or clock circuitry), a microcontroller, a transceiver, etc.

The same reference numbers (or other reference designators) are used in the drawings to designate the same or similar (structurally and/or functionally) features. FIG. 1 is a block diagram of a tunable BAW resonator 100 in accordance with an example embodiment. In the example of FIG. 1, the tunable BAW resonator 100 includes a BAW resonator core 102 having a first electrode 104, a second electrode 106, and a piezoelectric layer 108 between the first electrode 104 and the second electrode 106. As a first option, the tunable BAW resonator 100 includes a first Bragg mirror 110 adjacent to the BAW resonator core 102. The first Bragg mirror 110 has a first metal layer 114 and a first dielectric layer 112 between the first metal layer 114 and the first electrode 104 (e.g., the first metal layer 114 is embedded in the first dielectric layer 112) of the BAW resonator core 102. As a second option, the tunable BAW resonator 100 includes a second Bragg mirror 116 adjacent to the BAW resonator core 102 (e.g., the first Bragg mirror 110 and the second Bragg mirror 116 on opposite sides of the BAW resonator core 102). The second Bragg mirror 116 has a second metal layer 120 and a second dielectric layer 118 between the second metal layer 120 and the second electrode 106 (e.g., the second metal layer 120 is embedded in the second dielectric layer 118) of the BAW resonator core 102. As shown, the metal layer In some example embodiments, the first Bragg mirror 110 is used and the second Bragg mirror 116 is omitted. In other example embodiments, the second Bragg mirror 116 is used and the first Bragg mirror 110 is omitted. In still other example embodiments, both the first Bragg mirror 110 and the second Bragg mirror 116 are used. As shown, the second Bragg mirror 116, the BAW resonator core 102, and the first Bragg mirror 110 are formed over a substrate 122 (e.g., a silicon substrate).

The tunable BAW resonator 100 also includes an RF signal source 124. More specifically, a first side of the RF signal source 124 is coupled to the first electrode 104 of the BAW resonator core 102, while a second side of the RF signal source 124 is coupled to the second electrode 106 of the BAW resonator 102. One option is for the first side of the RF signal source 124 to provide a first RF signal ($V_{in1}$) and for the second side of the RF signal source 124 to provide a second RF signal ($V_{in2}$). Another option is for the first side of the RF signal source 124 to provide $V_{in1}$ while for the second side of the RF signal source 124 is coupled to ground (GND). Another option is for the first side of the RF signal source 124 to be coupled to ground while the second side of the RF signal source 124 provides $V_{in2}$.

In some example embodiments, the first side of the RF signal source 124 is coupled to the first metal layer 114 of the first Bragg mirror 110 to provide $V_{in1}$ or a modified version of $V_{in1}$ to the first metal layer 114. The modification of $V_{in1}$ may be performed, for example, by a first amplifier circuit 126 between the first electrode 104 (coupled to the first side of the RF signal source 124) and the first metal layer 114. In some example embodiments, the first amplifier circuit 126 modifies $V_{in1}$ by applying a gain ($K_1$) to $V_{in1}$, which results in the parallel resonance frequency of the tunable BAW resonator 100 being adjusted. In different example embodiments, $K_1$ may amplify $V_{in1}$ or attenuate $V_{in1}$. Additionally or alternatively, the first amplifier circuit 126 modifies $V_{in1}$ by applying a phase shift ($\theta_1$) to $V_{in1}$, which results in the parallel Q factor of the tunable BAW resonator 100 being adjusted. Example values for 81 are 0° and 180°. As another option, the first Bragg mirror 110 is not used to adjust parallel resonance frequency tuning and/or the parallel Q factor tuning of the tunable BAW resonator 100, and the first amplifier circuit 126 is omitted.

In some example embodiments, the second side of the RF signal source 124 is coupled to the second metal layer 120 of the second Bragg mirror 116 to provide a modified versation of $V_{in2}$ to the second metal layer 120. The modification of $V_{in2}$ may be performed, for example, by a second amplifier circuit 128 between the second electrode 106 (coupled to the second side of the RF signal source 124) and the second metal layer 120. In some example embodiments, the second amplifier circuit 128 modifies $V_{in2}$ by applying a gain ($K_2$) to $V_{in2}$, which results in the parallel resonance frequency of the tunable BAW resonator 100 being adjusted. In different example embodiments, $K_2$ may amplify $V_{in2}$ or attenuate $V_{in2}$. Additionally or alternatively, the second amplifier circuit 128 may modify $V_{in2}$ by applying a phase shift ($\theta_2$) to $V_{in2}$, which results in the parallel Q factor of the tunable BAW resonator 100 being adjusted. Example values for 82 are 0° and 180°. As another option, the second Bragg mirror 116 is not used to adjust tuning of the tunable BAW resonator 100, and the second amplifier circuit 128 is omitted. In different example embodiments, parallel resonance frequency tuning and/or parallel Q factor tuning of the tunable BAW resonator is based on application of a first RF signal (e.g., $V_{in1}$ or a modified version of $V_{in1}$) to the first metal layer 114 of the first Bragg mirror 110 and/or application of a second RF signal (e.g., $V_{in2}$ or a modified version of $V_{in2}$) to the second metal layer 120 of the second Bragg mirror 116.

Figure 2A:
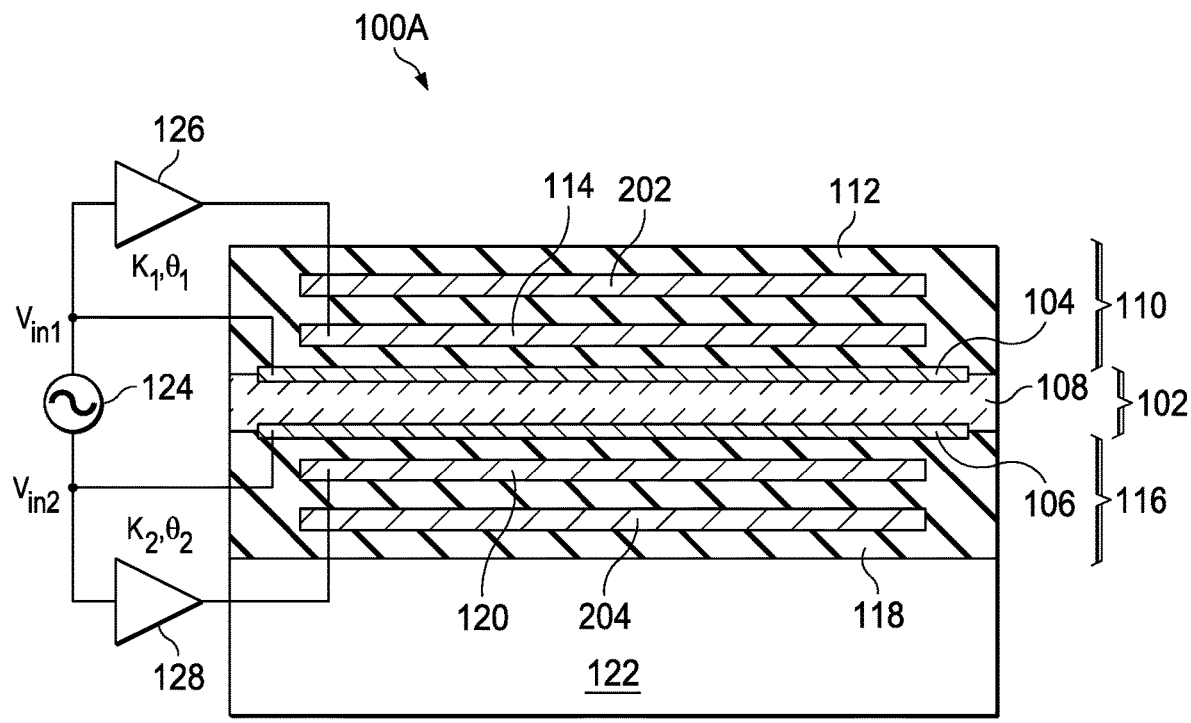
FIGS. 2A-2G are diagrams of tunable BAW resonators in accordance with various example embodiments.

FIGS. 2A-2G are diagrams of tunable BAW resonators 100A-100G (examples of the tunable BAW resonator 100 in FIG. 1) in accordance with various example embodiment. In the example of FIG. 2A, the tunable BAW resonator 100A includes the BAW resonator core 102, the first Bragg mirror 110, the second Bragg mirror 116, the substrate 122, the RF signal source 124, the first amplifier circuit 126, and the second amplifier circuit 128 described for FIG. 1. As shown, the first Bragg mirror 110 may include an additional metal layer 202 separated from the first metal layer 114 by some of the dielectric layer 112. Also, the second Bragg mirror 116 may include an additional metal layer 204 separated from the second metal layer 120 by some of the dielectric layer 118. In some example embodiments, the Bragg mirror metal layers (e.g., metal layers 114, 202, 120, and 204) are high impedance (Z) metals (e.g., a titanium-tungsten (TiW) alloy) and the Bragg mirror dielectric layers (e.g., the dielectric layers 112 and 118) are low Z dielectrics (e.g., silicon-oxide ($SiO_2$)). Without limitation, the options described for the Bragg mirror metal layers and Bragg mirror dielectric layers in FIG. 2A are applicable to other embodiments (e.g., the embodiments of FIGS. 1 and 2B-2G).

In the example of FIG. 2A, a first side of the RF signal source 124 provides $V_{in1}$ to the first electrode 104 of the BAW resonator core 102, while a second side of the RF signal source 124 provides $V_{in2}$ to the second electrode 106 of the BAW resonator core 102. To adjust the parallel resonance frequency and/or the parallel Q factor of the tunable BAW resonator 100A, $V_{in1}$ at the first side of the RF signal source 124 is modified by the first amplifier circuit 126 and the modified version of $V_{in1}$ is applied to the first metal layer 114 of the first Bragg mirror 110. As another option, $V_{in2}$ at the second side of the RF signal source 124 is modified by the second amplifier circuit 128. The modified version of $V_{in2}$ is applied to the second metal layer 120 of the second Bragg mirror 116. In different example embodiments, the values of $K_1$ (applied to $V_{in1}$), $\theta_1$ (applied to $V_{in1}$), $K_2$ (applied to $V_{in2}$), and $\theta_2$ (applied to $V_{in2}$) are selected or adjusted for parallel resonance frequency tuning and/or the parallel Q factor tuning of the tunable BAW resonator 100A. $K_1$ may be greater than, less than, or equal to $K_2$ (applied to $V_{in2}$). Also, $\theta_1$ may be equal to $\theta_2$ or offset from $\theta_2$ In some example embodiments, $\theta_1$ and $\theta_2$ are offset by 180° degrees.

Figure 2B:
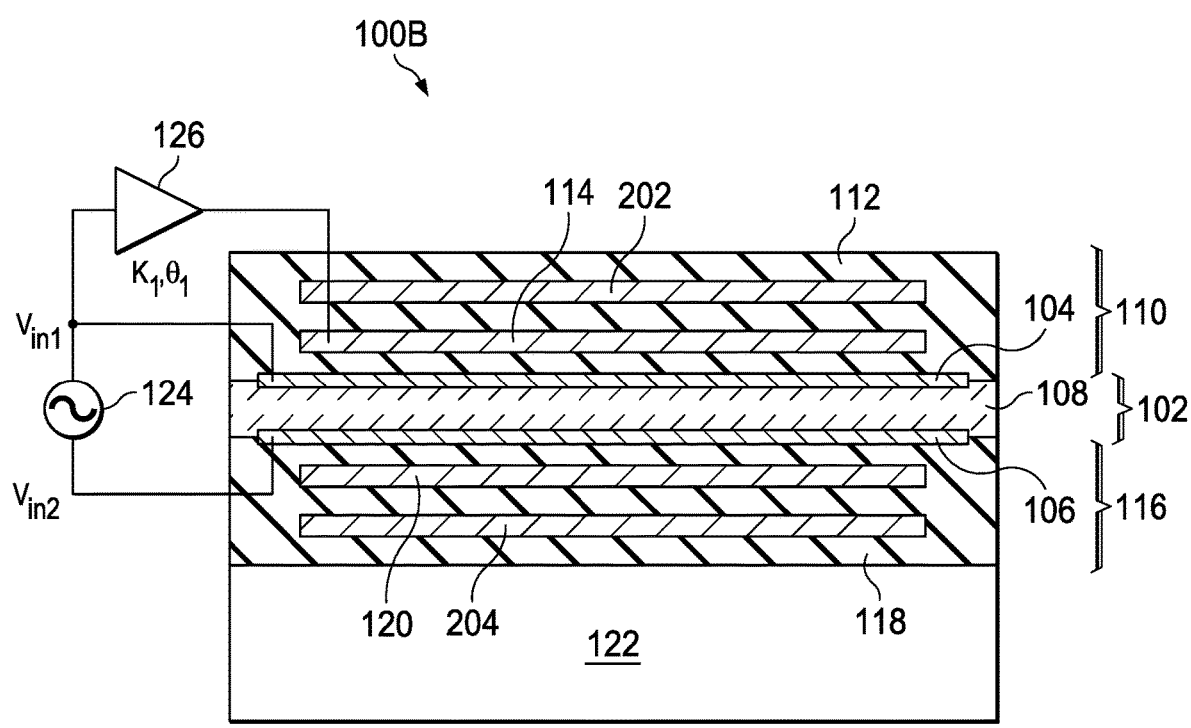

In FIG. 2B, the tunable BAW resonator 100B includes the BAW resonator core 102, the first Bragg mirror 110, the second Bragg mirror 116, the substrate 122, the RF signal source 124, and the first amplifier circuit 126 described for FIG. 1. As shown in FIG. 2B, the second amplifier circuit 128 is omitted, and the first Bragg mirror 110 may include an additional metal layer 202 separated from the first metal layer 114 by some of the dielectric layer 112. Also, the second Bragg mirror 116 may include an additional metal layer 204 separated from the second metal layer 120 by some of the dielectric layer 118.

In the example of FIG. 2B, a first side of the RF signal source provides $V_{in1}$ to the first electrode 104 of the BAW resonator core 102, while a second side of the RF signal source 124 provides $V_{in1}$ to the second electrode 106 of the BAW resonator core 102. To adjust the parallel resonance frequency and/or the parallel Q factor of the tunable BAW resonator 100B, $V_{in1}$ is modified (e.g., $K_1$ and/or $\theta_1$ are applied to $V_{in1}$) by the first amplifier circuit 126. The modified version of $V_{in1}$ is applied to the first metal layer 114 of the first Bragg mirror 110. In the example of FIG. 2B, an RF signal is not applied to the second metal layer 120 of the second Bragg mirror 116, and the second amplifier circuit 128 is omitted.

Figure 2C:
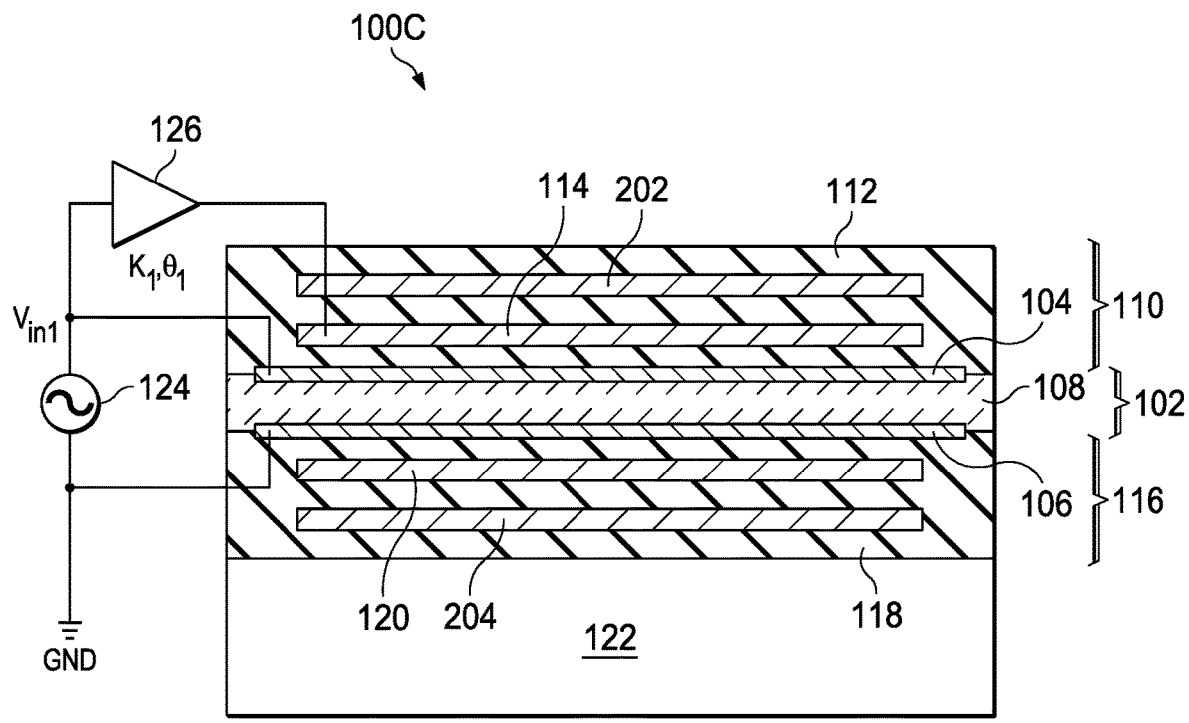

In FIG. 2C, the tunable BAW resonator 100C includes the BAW resonator core 102, the first Bragg mirror 110, the second Bragg mirror 116, the substrate 122, the RF signal source 124, and the first amplifier circuit 126 described for FIG. 1. As shown, the second amplifier circuit 128 is omitted, and the first Bragg mirror 110 may include an additional metal layer 202 separated from the first metal layer 114 by some of the dielectric layer 112. Also, the second Bragg mirror 116 may include an additional metal layer 204 separated from the second metal layer 120 by some of the dielectric layer 118.

In the example of FIG. 2C, the first side of the RF signal source provides $V_{in1}$ to the first electrode 104 of the BAW resonator core 102. The second side of the RF signal source and the second electrode 106 of the BAW resonator core 102 are coupled to ground. To adjust the parallel resonance frequency and/or the parallel Q factor of the tunable BAW resonator 100C, $V_{in1}$ is modified (e.g., $K_1$ and/or $\theta_1$ are applied to $V_{in1}$) by the first amplifier circuit 126. The modified version of $V_{in1}$ is applied to the first metal layer 114 of the first Bragg mirror 110. In the example of FIG. 2C, an RF signal is not applied to the second metal layer 120 of the second Bragg mirror 116, and the second amplifier circuit 128 is omitted.

Figure 2D:
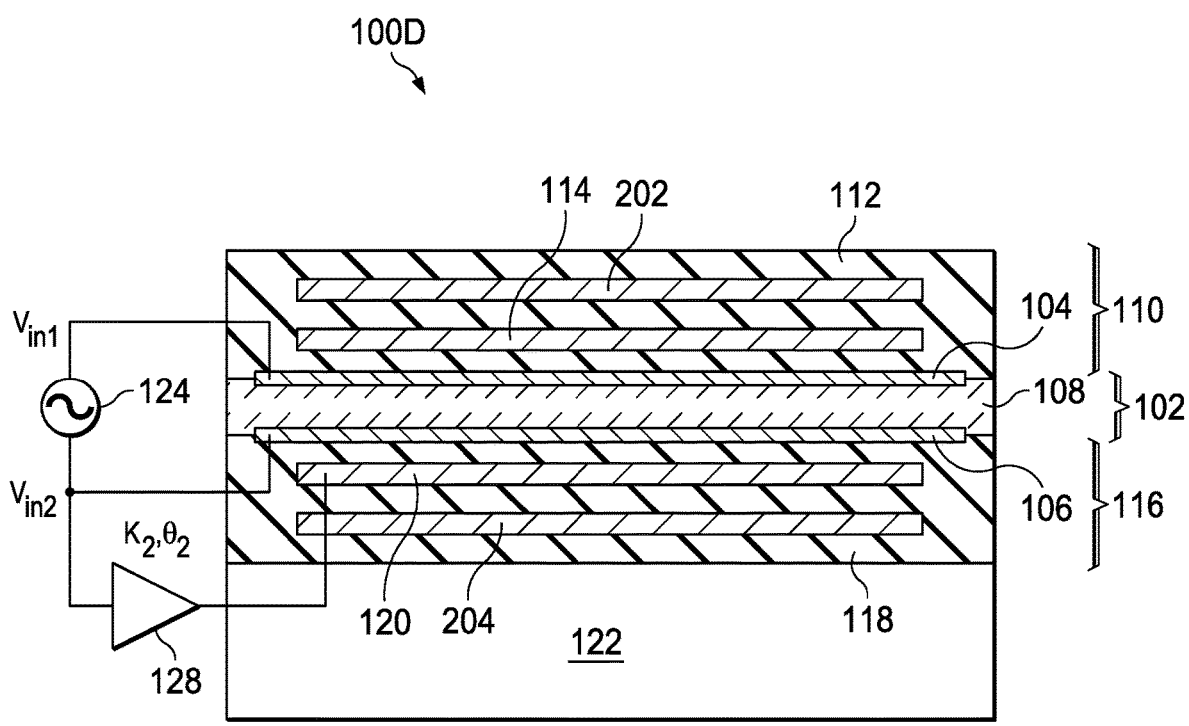

In FIG. 2D, the tunable BAW resonator 100D includes the BAW resonator core 102, the first Bragg mirror 110, the second Bragg mirror 116, the substrate 122, the RF signal source 124, and the second amplifier circuit 128 described for FIG. 1. As shown, the first amplifier circuit 126 is omitted, and the first Bragg mirror 110 may include an additional metal layer 202 separated from the first metal layer 114 by some of the dielectric layer 112. Also, the second Bragg mirror 116 may include an additional metal layer 204 separated from the second metal layer 120 by some of the dielectric layer 118.

In the example of FIG. 2D, a first side of the RF signal source provides $V_{in1}$ to the first electrode 104 of the BAW resonator core 102, while a second side of the RF signal source 124 provides $V_{in2}$ to the second electrode 106 of the BAW resonator core 102. To adjust the parallel resonance frequency and/or the parallel Q factor of the tunable BAW resonator 100B, $V_{in2}$ at the second side of the RF signal source 124 is modified (e.g., $K_2$ and/or $\theta_2$ are applied to $V_{in2}$) by the second amplifier circuit 128. The modified version of $V_{in2}$ is applied to the second metal layer 120 of the second Bragg mirror 116. In the example of FIG. 2D, an RF signal is not applied to the first metal layer 114 of the first Bragg mirror 110, and the first amplifier circuit 126 is omitted.

Figure 2E:
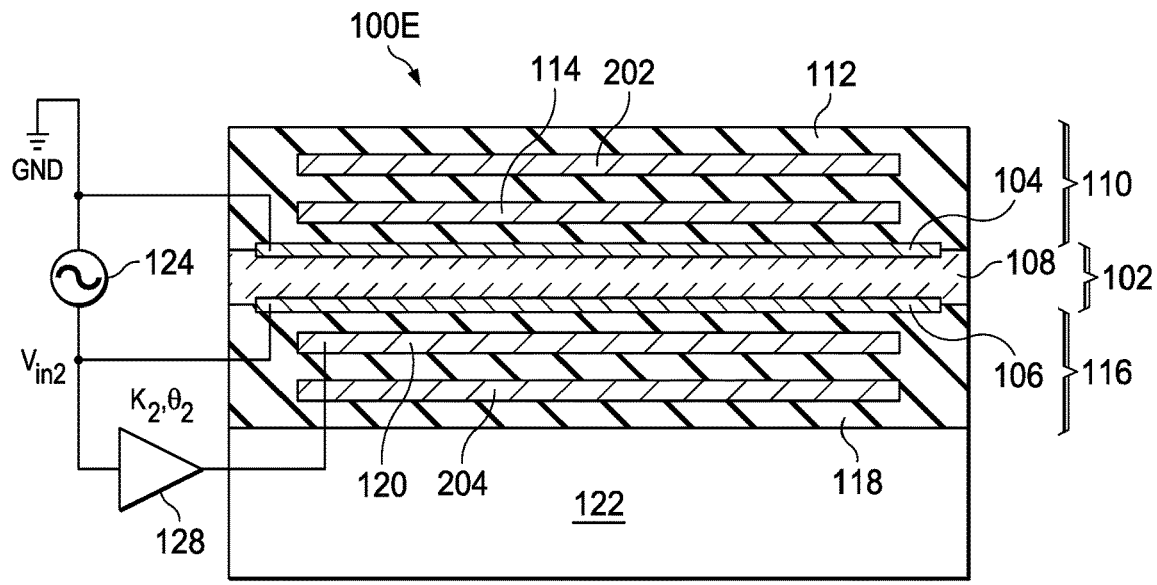

In FIG. 2E, the tunable BAW resonator 100E includes the BAW resonator core 102, the first Bragg mirror 110, the second Bragg mirror 116, the substrate 122, the RF signal source 124, and the second amplifier circuit 128 described for FIG. 1. As shown, the first amplifier circuit 126 is omitted, and the first Bragg mirror 110 may include an additional metal layer 202 separated from the first metal layer 114 by some of the dielectric layer 112. Also, the second Bragg mirror 116 may include an additional metal layer 204 separated from the second metal layer 120 by some of the dielectric layer 118.

In the example of FIG. 2E, the second side of the RF signal source provides $V_{in2}$ to the second electrode 106 of the BAW resonator core 102. The first side of the RF signal source 124 and the first electrode 104 of the BAW resonator core 102 are coupled to ground. To adjust the parallel resonance frequency and/or the parallel Q factor of the tunable BAW resonator 100E, $V_{in2}$ at the second side of the RF signal source 124 is modified (e.g., $K_2$ and/or $\theta_2$ are applied to $V_{in2}$) by the second amplifier circuit 128. The modified version of $V_{in2}$ is applied to the second metal layer 120 of the second Bragg mirror 116. In the example of FIG. 2E, an RF signal is not applied to the first metal layer 114 of the first Bragg mirror 110, and the first amplifier circuit 126 is omitted.

Figure 2F:
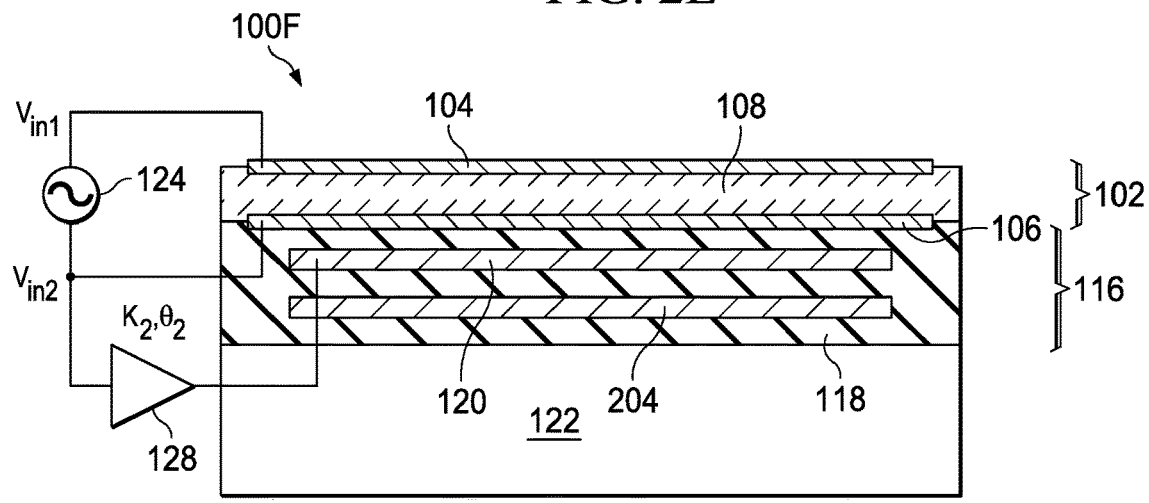

In FIG. 2F, the tunable BAW resonator 100F includes the BAW resonator core 102, the second Bragg mirror 116, the substrate 122, the RF signal source 124, and the second amplifier circuit 128 described for FIG. 1. As shown, the first Bragg mirror 110 and the first amplifier circuit 126 are omitted. Also, the second Bragg mirror 116 may include an additional metal layer 204 separated from the second metal layer 120 by some of the dielectric layer 118.

In the example of FIG. 2F, a first side of the RF signal source provides $V_{in1}$ to the first electrode 104 of the BAW resonator core 102, while a second side of the RF signal source 124 provides $V_{in2}$ to the second electrode 106 of the BAW resonator core 102. To adjust the parallel resonance frequency and/or the parallel Q factor of the tunable BAW resonator 100B, $V_{in2}$ is modified (e.g., $K_2$ and/or $\theta_2$ are applied to $V_{in1}$) by the second amplifier circuit 128. The modified version of $V_{in2}$ is applied to the second metal layer 120 of the second Bragg mirror 116. In the example of FIG. 2F, the first Bragg mirror 110 and the first amplifier circuit 126 are omitted.

Figure 2G:
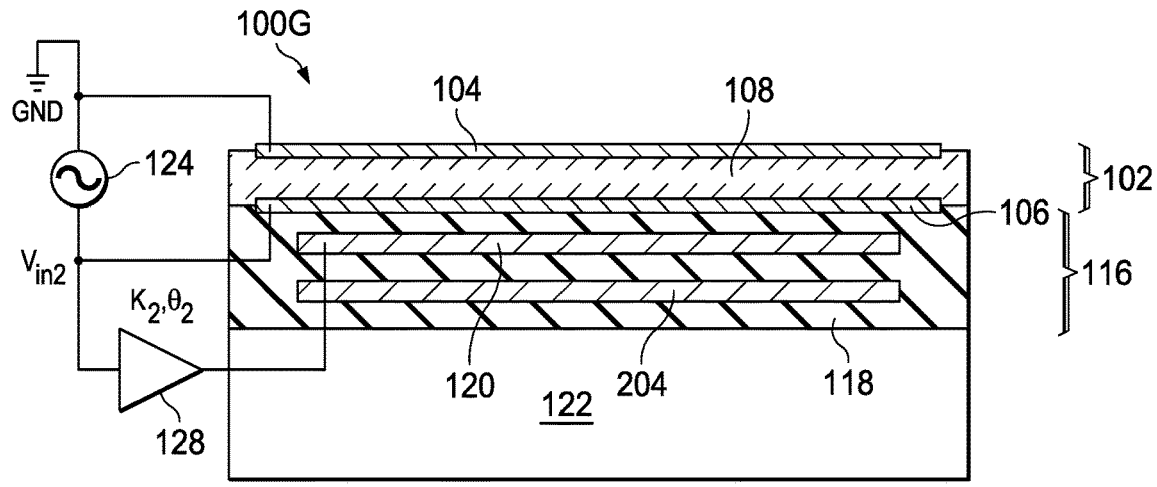

In FIG. 2G, the tunable BAW resonator 100G includes the BAW resonator core 102, the second Bragg mirror 116, the substrate 122, the RF signal source 124, and the second amplifier circuit 128 described for FIG. 1. As shown, the first Bragg mirror 110 and the first amplifier circuit 126 are omitted. Also, the second Bragg mirror 116 may include an additional metal layer 204 separated from the second metal layer 120 by some of the dielectric layer 118.

In the example of FIG. 2G, a second side of the RF signal source provides $V_{in1}$ to the second electrode 106 of the BAW resonator core 102, while a first side of the RF signal source 124 and the first electrode 104 of the BAW resonator core 102 are coupled to ground. To adjust the parallel resonance frequency and/or the parallel Q factor of the tunable BAW resonator 100G, $V_{in2}$ is modified (e.g., $K_2$ and/or $\theta_2$ are applied to $V_{in2}$) by the second amplifier circuit 128. The modified version of $V_{in1}$ is applied to the second metal layer 120 of the second Bragg mirror 116. In the example of FIG. 2G, the first Bragg mirror 110 and the first amplifier circuit 126 are omitted.

In other example embodiments, the first Bragg mirror 110 in included and the second Bragg mirror 116 is omitted. In such embodiments, changing the parallel resonance frequency and/or the parallel Q factor of a tunable BAW resonator involves applying an RF signal to the first metal layer 114 of the first Bragg mirror 110. As another option, an RF signal may be applied to multiple metal layers of a given Bragg mirror. It should also be noted that each Bragg mirror has the additional function of providing acoustic isolation for the BAW resonator core 102, and that the thickness of the dielectric layer, the number of metal layers, and the spacing of the metal layers for a given Bragg mirror may vary. Such variations may be considered when applying an RF signal to a given metal layer of a Bragg mirror to adjust the parallel resonance frequency and/or the parallel Q factor of a tunable BAW resonator.

Other options for the tunable BAW resonators 100A-100G relate to adjusting $K_1$, $K_2$, $\theta_1$ and/or $\theta_2$. In some example embodiments, $K_1$ or $K_2$ is adjustable based on trimming a component (e.g., a trimmable resistor) of a related amplifier circuit. Additionally or alternatively, $K_1$ or $K_2$ is adjustable based on providing a control signal to an adjustable component (e.g., a variable resistor) of a related amplifier circuit. In some example embodiments, adjustment options for $K_1$ or $K_2$ include course adjustment options and/or fine adjustment options. By adjusting $K_1$ or $K_2$, the parallel resonance frequency of the tunable BAW resonators 100A-100G changes. In some example embodiments, each amplifier circuit includes a VCVS to enable course and/or fine gain adjustment options. Also, $\theta_1$ and $\theta_2$ may be selected or adjusted within a specific range of values that depends on $K_1$ and $K_2$, respectively, to improve the parallel quality factor. In some example embodiments, $\theta_1$ or $\theta_2$ is selectable or adjustable based on trimming a component that can generate a time delay (e.g., a trimmable capacitor) of a related amplifier circuit. Additionally or alternatively, $\theta_1$ or $\theta_2$ is selectable or adjustable based on providing a control signal to an adjustable component that can generate a time delay (e.g., a varactor) of a related amplifier circuit. In some example embodiments, adjustment options for $\theta_1$ or $\theta_2$ include course adjustment options and/or fine adjustment options. To adjust $\theta_1$ and/or $\theta_2$, a time delay is introduced by the amplifier circuit. Such time delays may be based on one or more capacitor and/or inductors.

Figure 3A:
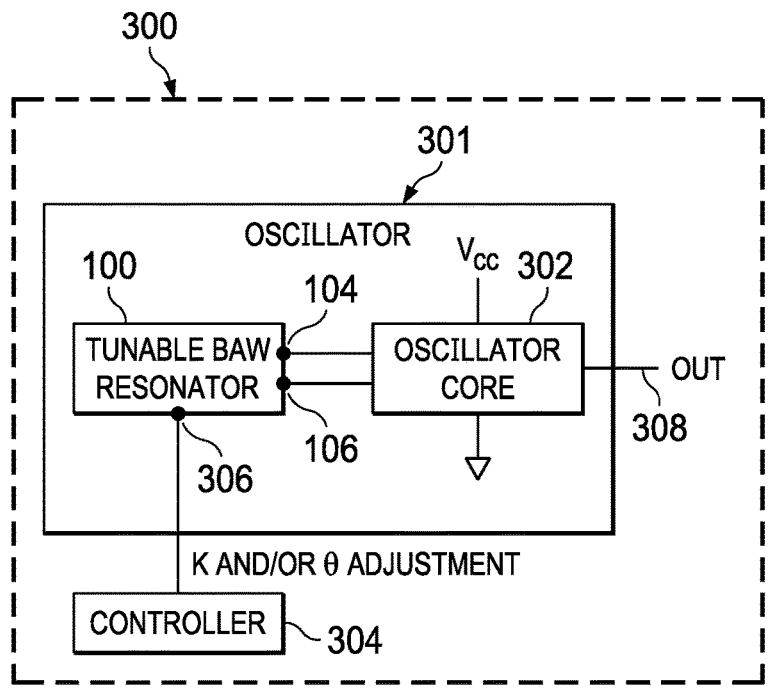
FIGS. 3A-3C are block diagrams of systems having a tunable BAW resonator in accordance with various example embodiments.
Figure 3B:
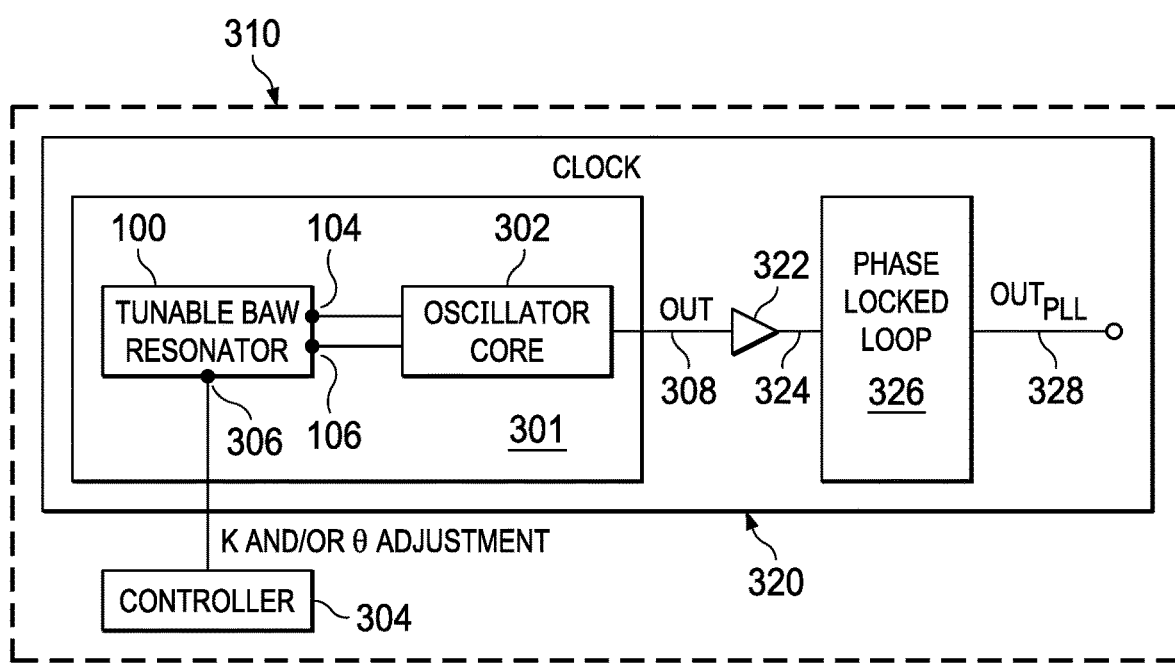
Figure 3C:
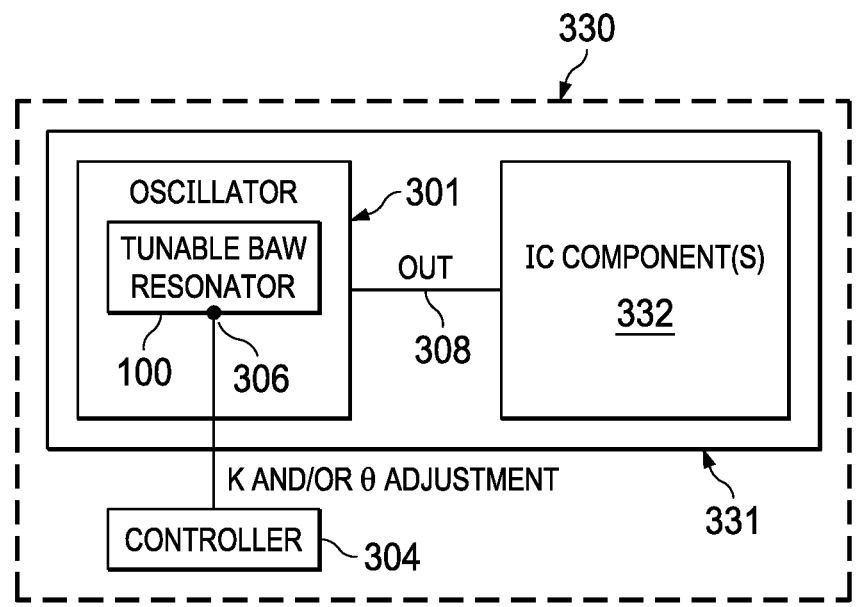

FIGS. 3A-3C are block diagrams of systems 300, 310, and 330 having a tunable BAW resonator (e.g., the tunable BAW resonator 100 in FIG. 1, or the tunable BAW resonators 100A-100G in FIGS. 2A-2G) in accordance with various example embodiments. In the system 300 of FIG. 3A, the tunable BAW resonator 100 is part of an oscillator circuit 301. As shown, the first electrode 104 and the second electrode 106 of the tunable BAW resonator 100 are coupled to an oscillator core 302. The oscillator core 302 is powered by a supply voltage ($V_{CC}$) and is coupled to ground. As desired, the parallel resonance frequency and/or the parallel Q factor of the tunable BAW resonator 100 is adjustable as described herein. In some example embodiments, the tunable BAW resonator 100 includes an input 306 coupled to a controller 304. In the example of FIG. 3A, the controller 304 is configured to provide K and/or θ adjustment signals to the input 306. The input 306 is coupled to an amplifier circuit (e.g., the first amplifier circuit 126 or the second amplifier circuit 128 in FIGS. 1 and 2A-2G) of the tunable BAW resonator 100, where the amplifier circuit has an adjustable component. As another option, the tunable BAW resonator 100 may include an amplifier circuit having a previously selected K and θ so the tunable BAW resonator 100 complies with a target parallel resonance frequency and/or target parallel quality factor (Q). In such case, the K and/or θ adjustment signals provided by the controller 304 may be omitted or may be used in combination with the previously selected K and θ values. The output signal 308 (labeled OUT) from the oscillator core 302 is a signal whose frequency is based on the tunable BAW resonator 100.

In the system 310 of FIG. 3B, the tunable BAW resonator 100 is part of a clock circuit 320. As shown, the clock circuit 320 includes the oscillator circuit 301 described in FIG. 3A. The output signal 308 from the oscillator circuit 301 is provided as an input to a phase-locked loop (PLL) 326 via a gain buffer 322. More specifically, the output signal 308 becomes input signal 324, which is used by the PLL 326 to generate an output signal 328 (labeled $OUT_{PLL}$), which has a frequency based on the tunable BAW resonator 100. For the system 310, the parallel resonance frequency of the tunable BAW resonator 100 is adjustable based on fixed adjustment options (e.g., trimming a component of an amplifier circuit), dynamic adjustment options (e.g., providing the K and/or θ adjustment signals to the input 306 of the tunable BAW resonator 100), or a combination thereof.

In the system 330 of FIG. 3C, the tunable BAW resonator 100 is part of an integrated circuit 331 that includes the oscillator circuit 301 and IC component(s) 332. Without limitation, the IC component(s) 236 may include a processor, a transmitter, a receiver, a peripheral, a network interface, and/or a radar component. The IC component(s) 332 uses the output signal 308 generated by the oscillator circuit 301. In the example of FIG. 3C, the output signal 308 has a frequency that is adjustable based on the tunable BAW resonator 100. The IC components 332 may use the output signal 308 as a timing signal and/or may generate other timing signals based on the output signal 308. For the system 330, the parallel resonance frequency and/or parallel Q factor of the tunable BAW resonator 100 is adjustable based on fixed adjustment options (e.g., trimming a component of an amplifier circuit), dynamic adjustment options (e.g., providing the K and/or θ adjustment signals to the input 306 of the tunable BAW resonator 100), or a combination thereof.

In some example embodiments, the controller 304 in FIGS. 3A-3C is separate from an oscillator circuit (e.g., the oscillator circuit 301 in FIGS. 3A-3C), a clock circuit (e.g., the clock circuit 320 in FIG. 3B), or other timing circuits. In other example embodiments, the controller 304 is part of an oscillator circuit, a clock circuit, or other timing circuit. In some example embodiments, a system includes a timing circuit coupled to an oscillator circuit and configured to provide a clock signal; and a component coupled to the timing circuit and configured to receive a clock signal (see e.g., systems 310 and 300 in FIGS. 3B and 3C).

In some example embodiments, the controller 304 adjusts the control signal(s) provided (e.g., K and/or θ adjustments) based on control parameter(s) such as a temperature measurement, stress measurement, predetermined frequency drift values, and/or measured frequency drift values. In some example embodiments, the controller 304 includes internal components to obtain temperature measurements, stress measurements, predetermined frequency drift values, and/or measured frequency drift values. In other examples, the controller 304 obtains temperature measurements, stress measurements, predetermined frequency drift values, and/or measured frequency drift values from external components (not shown).

In some example embodiments, the systems 300, 310, and 330 include IC components in a stacked package (e.g., flip chip assembly) or a lateral package arrangement. In other example embodiments, the systems 300, 310, and 330 include components that are part of the same IC die. In different example embodiments, a tunable BAW resonator (e.g., the tunable BAW resonator 100 in FIGS. 1 and 3A-3C, or the tunable BAW resonators 100A-100G in FIGS. 1A-1G), an oscillator circuit (e.g., the oscillator circuit 301 in FIGS. 3A-3C), a clock circuit (e.g., the clock circuit 320 in FIG. 3B), or an IC-based system (e.g., the system 330 in FIG. 3C) are implemented using one IC (one unpackaged or packaged die) or multiple ICs (multiple unpackaged or packaged dies). When multiple ICs are used, the ICs can be packaged together or separately. When packaged separately, a printed circuit board (PCB) and related wires, traces, or other couplers may be used to connect the separate ICs.

In operation, the tunable BAW resonator 100 is a very high-quality (very narrow band) bandpass filter. When combined with an oscillator core (e.g., the oscillator core 302 in FIGS. 3A and 3B), the tunable BAW resonator 100 and oscillator core function as a signal generator (e.g., generating a sinusoidal or square waveform at a predetermined and precise BAW series or parallel resonance frequency). In various examples, the oscillator core 302 includes active and passive circuit elements (e.g., capacitors) capable of sustaining oscillations and amplifying the signal from the tunable BAW resonator 300 to generate and provide the output signal 308. Construction features of the tunable BAW resonator device 300 (e.g., the thickness of its piezoelectric layer(s)) along with the tuning options described herein determine the oscillation frequency. In one example embodiment, the oscillator core 302 is a Colpitts oscillator.

FIG. 4A is a graph 400 of admittance as a function of frequency for different amplifier gain values ($K_1$) and phase shift values ($\theta_1$) related to a tunable BAW resonator (e.g., the tunable BAW resonator 100 in FIGS. 1 and 3A-3C, or the tunable BAW resonators 100A-100G in FIGS. 2A-2G) in accordance with various example embodiments. In graph 400, admittance as a function of frequency are shown for $K_1$ equal to −1, −0.5, 0, 0.5, and 1. Meanwhile, $\theta_1$ is either 180° or 0°. As shown, the frequency of the minimum admittance peaks varies for different values of $K_1$ and $\theta_1$. With variance in the minimum admittance peaks for different values of $K_1$ and $\theta_1$, the parallel resonance frequency of a tunable BAW resonator can be varied by changing of $K_1$ and/or $\theta_1$ for an amplifier circuit (e.g., the first amplifier circuit 126 in FIGS. 1 and 2A-2G). Additionally or alternatively, $K_2$ and $\theta_2$ may be adjusted to vary the parallel resonance frequency of a tunable BAW resonator.

Figure 4B:
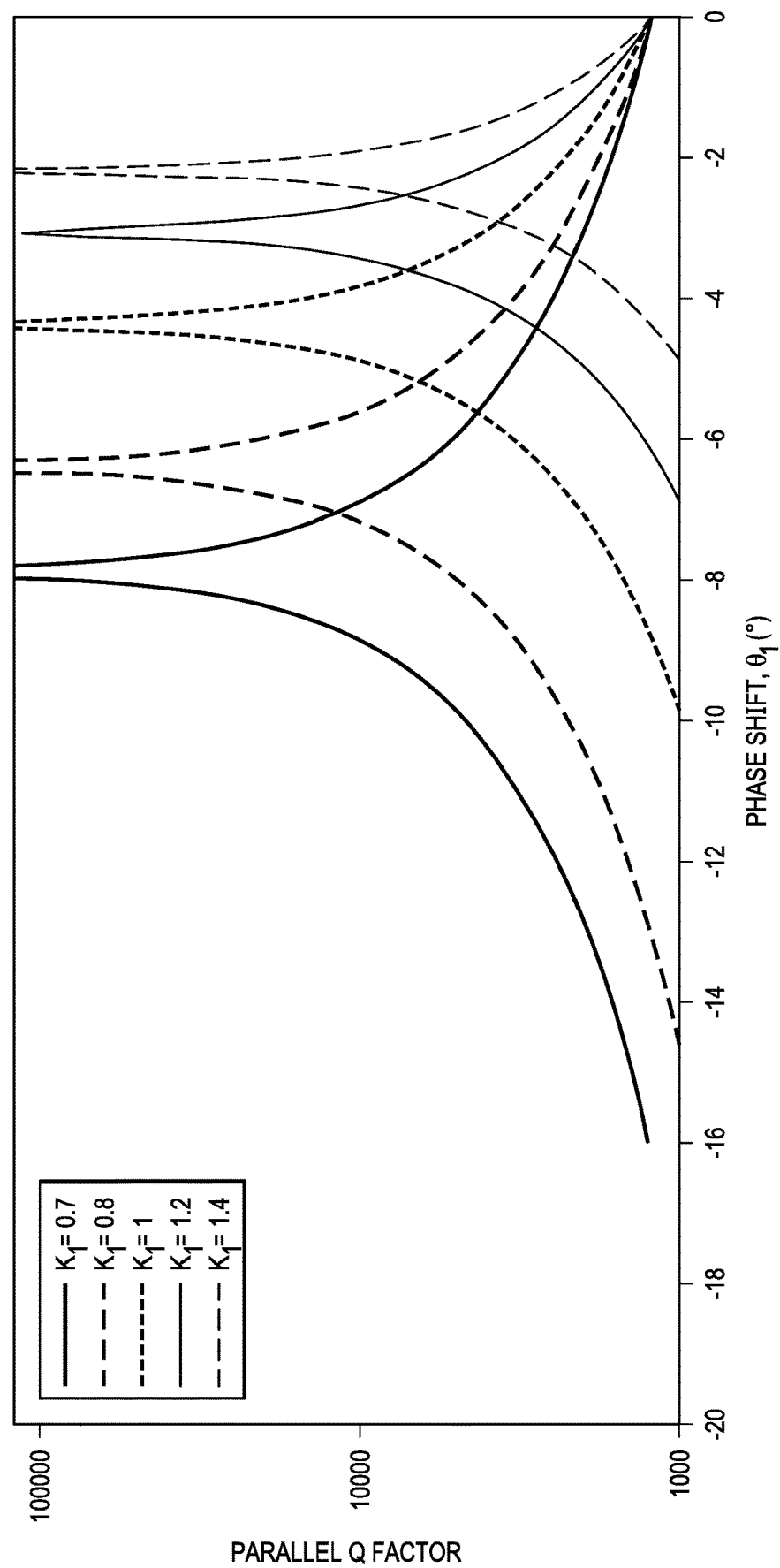
FIG. 4B is a graph of parallel Q factor as a function of phase shift for different amplifier gain values related to a tunable BAW resonator in accordance with various example embodiments.

FIG. 4B is a graph 410 of parallel Q factor as a function of phase shift for different amplifier gain values related to a tunable BAW resonator (e.g., the tunable BAW resonator 100 in FIGS. 1 and 3A-3C, or the tunable BAW resonators 100A-100G in FIGS. 2A-2G) in accordance with various example embodiments. As shown, the phase shift at which the parallel Q factor peaks varies for different values of $K_1$. For example, to improve the parallel Q factor when $K_1$=0.7, $\theta_1$ needs to be set within the range of −16° to 0°. With variance in the parallel Q factor for different values of $K_1$ and $\theta_1$, the parallel Q factor of a tunable BAW resonator can be varied by changing of $K_1$ and/or $\theta_1$ for an amplifier circuit (e.g., the first amplifier circuit 126 in FIGS. 1 and 2A-2G). Additionally or alternatively, $K_2$ and $\theta_2$ may be adjusted to vary the parallel Q factor of a tunable BAW resonator.

Figure 5:
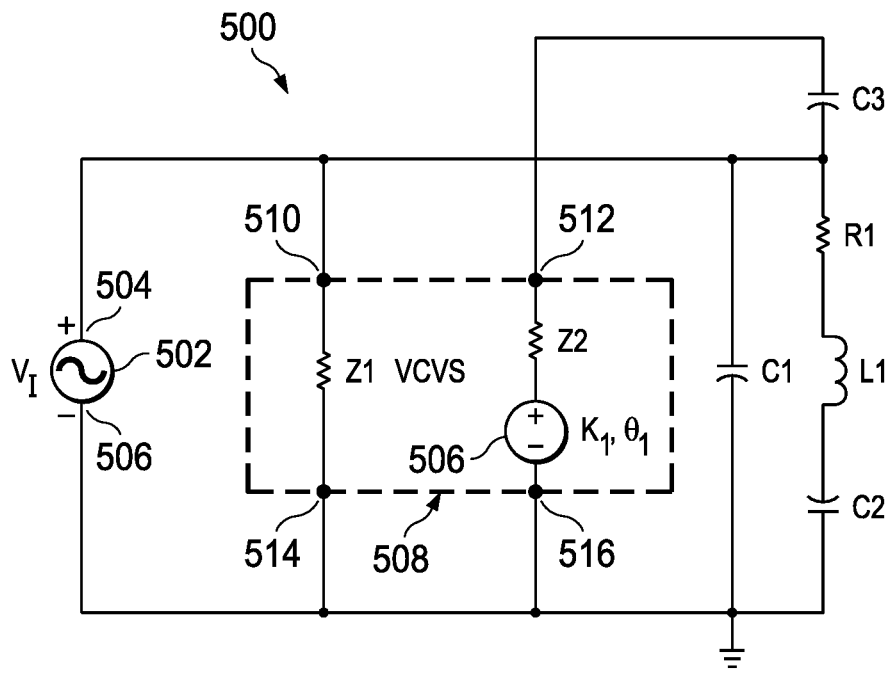
FIG. 5 is a schematic diagram of an equivalent circuit related to a tunable BAW resonator in accordance with an example embodiment.

FIG. 5 is a schematic diagram of an equivalent circuit 500 related to a tunable BAW resonator with an example embodiment. As shown, the equivalent circuit 500 includes an RF signal source 502 coupled in parallel with a first capacitor (C1) and an RLC circuit. The RLC circuit includes a first resistor (R1), a first inductor (L1), and a second capacitor (C2). The RF signal source 502 is also coupled to a VCVS 508 having a first terminal 510, a second terminal 512, a third terminal 514, and a fourth terminal 516. A first side 504 of the RF signal source 502 is coupled to the first terminal 510 of the VCVS 508. The first side 504 of the RF signal source 502 is also coupled to the second terminal 512 of the VCVS 508 via a third capacitor (C3). Between the first terminal 310 and the third terminal 514 is a first impedance (Z1). In some example embodiments, the value of Z1 is high (e.g., above 10 kΩ). Between the second terminal 512 and the fourth terminal 516 is a voltage source 506 in series with a second impedance (Z2). In some example embodiments, the value of Z2 is low (e.g., below 1Ω). The third terminal 514, the fourth terminal 516, and the second side 506 of the RF signal source 502 are coupled to ground.

In the equivalent circuit 500, the RF signal source 502 corresponds to the RF signal source 124 in FIGS. 1 and 2A-2G. C1 in parallel with the R1, L1, and C2 in series corresponds to the BAW resonator core 102 in FIGS. 1 and 2A-2G. The VCVS 508 in the arrangement shown corresponds to an amplifier circuit (e.g., the first amplifier circuit 126 and/or the second amplifier circuit 128 in FIGS. 1 and 2A-2G). By changing the gain (e.g., $K_1$) and/or the phase shift (e.g., $\theta_1$) applied by the VCVS 508, the parallel resonance frequency and/or parallel Q factor of the equivalent circuit 500 is adjustable. Also, adjustments to the gain and/or the phase shift applied by the VCVS 508 may be used to vary the parallel Q factor of the equivalent circuit 500.

The equivalent circuit 500, is comparable to having an external varactor coupled in parallel across the electrodes of a BAW resonator core. Table 1 shows values for K, N factor, Rp, parallel frequency, and ppm shift. Here K is the gain, N factor is a size scaling factor for the external capacitor, the Rp value is a parallel resistance, the parallel frequency is the frequency of the BAW resonator that coincides with the minimum admittance peak, and the ppm shift is the relative frequency shift of the parallel resonance frequency calculated in parts-per-million.

TABLE 1

| K | N factor | Rp value | Parallel frequency | ppm shift |
|---|---|---|---|---|
| 1 | 0 | 12140 Ω | 2534.73 MHz | 0 |
| 0.5 | 0.5 | 6382 Ω | 2525.46 MHz | 3657 |
| 0 | 1 | 3921 Ω | 2520.18 MHz | 5740 |
| −0.5 | 1.5 | 2660 Ω | 2516.78 MHz | 7082 |
| −1 | 2 | 1925 Ω | 2514.4 MHz | 8020 |

Figure 6A:
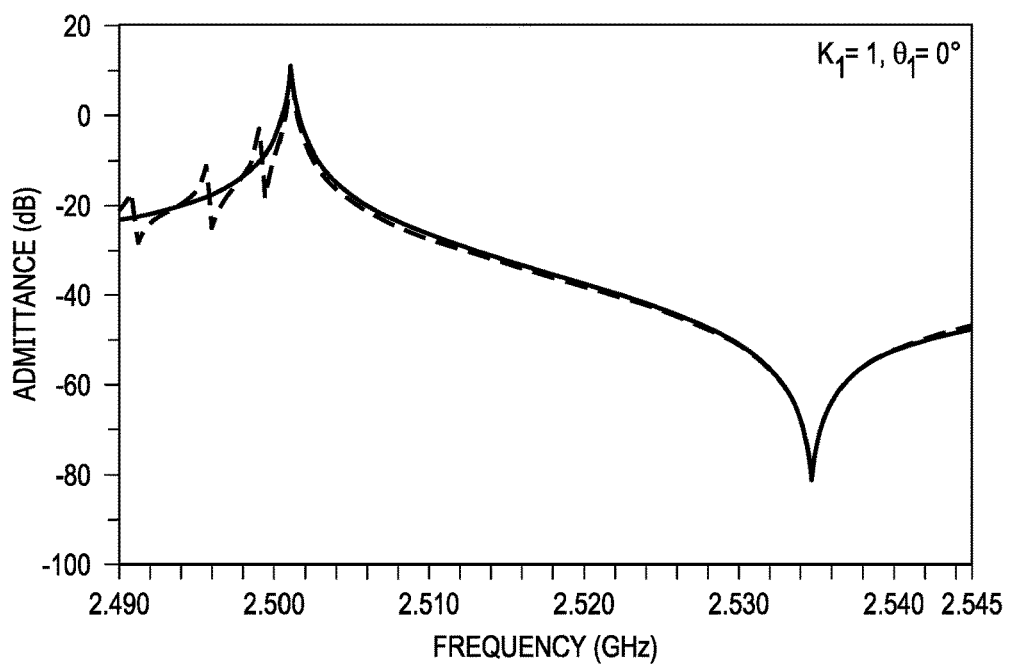
FIGS. 6A-6C are graphs of admittance as a function of frequency for different amplifier gain values related to a tunable BAW resonator in accordance with various example embodiments.
Figure 6B:
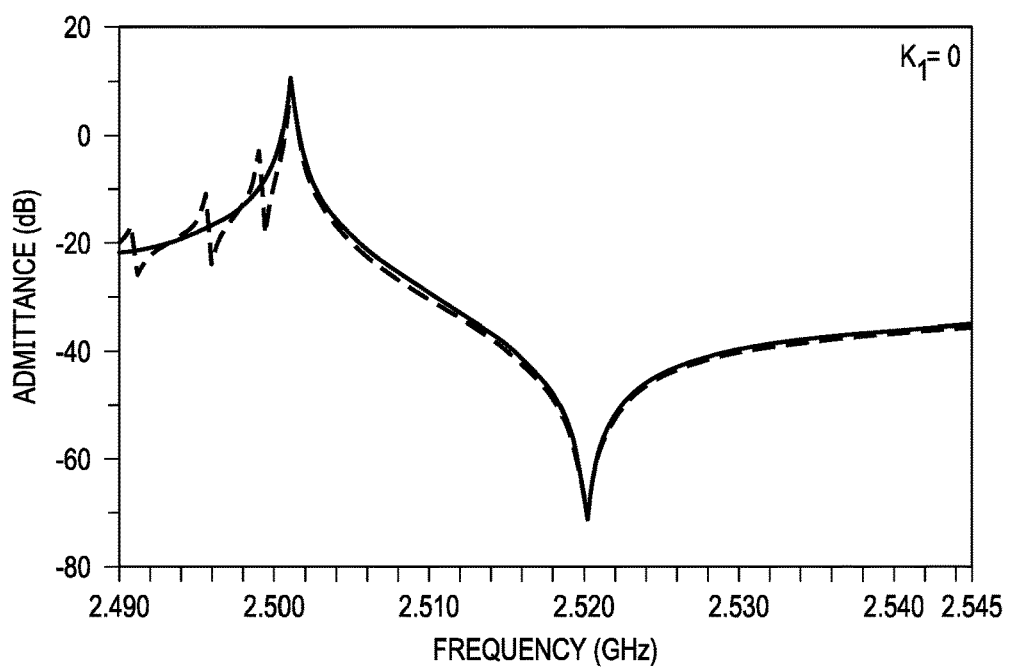
Figure 6C:
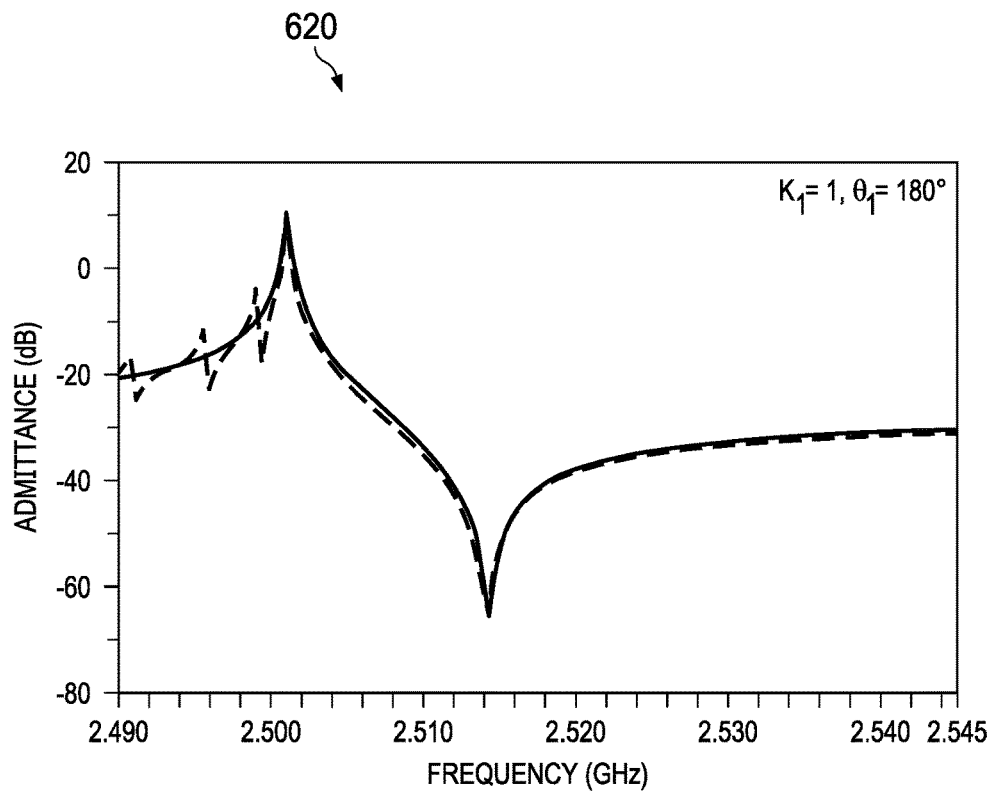

In the example of Table 1, varying K from 1 to −1 is comparable to varying the N factor from 0 to 2. The result of varying K changes the parallel frequency by up to 8000 ppm (from approximately 2534.73 MHz to 2514.4 MHz). Also, the Rp values varies from approximately 12140 ohms to 1925 ohms. In some example embodiments, Rp is given as:

$$R_p = \frac{1}{\omega_p^2 C_0^2 R_m} = \frac{k_t^2 Q_p}{\omega_p C_0},\qquad \text{Equation (1)}$$

where $k_t^2$ is the electromechanical coupling and relates to the series and parallel resonance frequencies (e.g., $k_t^2$ related to $(f_p^2-f_s^2)/f_s^2$, where $f_p$ is the parallel resonance frequency and $f_s$ is the series resonance frequency), $Q_p$ is the parallel Q factor and relates to the 3 dB bandwidth at parallel resonance (i.e., $Q_p$ relates to $f_p/\Delta f_{p,3dB}$), $\omega_p$ is the angular parallel frequency and relates to the parallel resonance as $2\pi f_p$, and $C_0$ is dielectric capacitance of the BAW resonator. $f_p$ FIGS. 6A-6C are graphs 600, 610, and 620 of admittance as a function of frequency for different amplifier gain (e.g., $K_1$) and phase shift (e.g., $\theta_1$) values related to a tunable BAW resonator (e.g., the tunable BAW resonator 100 in FIG. 1, or the tunable BAW resonators 100A-100G in FIGS. 2A-2G) in accordance with various example embodiments. In graph 600 of FIG. 6A, admittance as a function of frequency is shown for $K_1=1$ and $\theta_1=0°$. As shown in graph 600, the frequency of the minimum admittance peak when $K_1=1$ and $\theta_1=0°$ is about 2.535 GHz. In graph 610 of FIG. 6B, admittance as a function of frequency is shown for $K_1=0$. As shown in graph 610, the frequency of the minimum admittance peak when $K_1=0$ is about 2.520 GHz. In graph 620 of FIG. 6C, admittance as a function of frequency are shown for $K_1=1$ and $\theta_1=180°$. As shown in graph 620, the frequency of the minimum admittance peak when $K_1=1$ and $\theta_1=180°$ is about 2.515 GHz. With variance in the minimum admittance peaks for different values of $\theta_1$, the resonation frequency of a tunable BAW resonator can be varied by changing the phase shift (e.g., $\theta_1$) applied by an amplifier circuit (e.g., the first amplifier circuit 126 or the second amplifier circuit 128 in FIGS. 1 and 2A-2G) or related VCVS.

Figure 7:
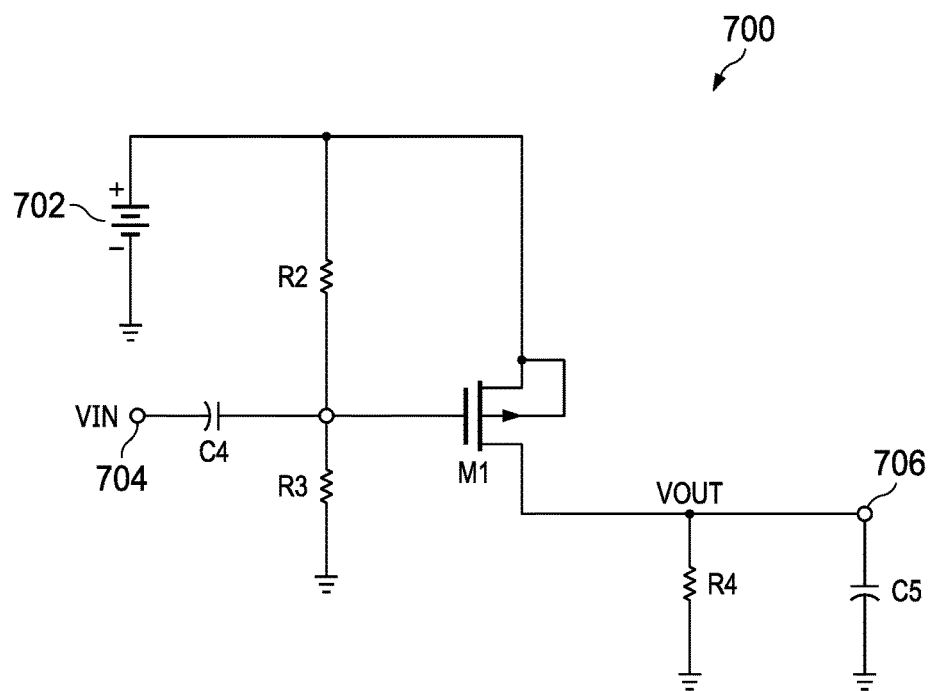
FIG. 7 is a schematic diagram representing a voltage-controlled voltage source (VCVS) related to a tunable BAW resonator in accordance with an example embodiment.

FIG. 7 is a schematic diagram representing a VCVS 700 related to a tunable BAW resonator in accordance with an example embodiment. In some example embodiments, the VCVS 700 is an example of the first amplifier circuit 126 or the second amplifier circuit 128 in FIGS. 1 and 2A-2G. As shown, the VCVS 700 includes an input 704 that receives an input voltage ($V_{IN}$) such as an RF signal (e.g., from the RF signal source 124 in FIGS. 1 and 2A-2G). The VCVS also includes a capacitor (C4). A first side of C4 is coupled to the input 704 and a second side of C4 is coupled to a control terminal (e.g., a gate terminal) of a p-type metal oxide semiconductor field-effect transistor (MOSFET) or "pMOS" transistor (M1). The gate terminal of M1 is also between resistors R2 and R3, which function as a voltage divider. The voltage at a first side of R2 is provided by a DC voltage source 702. The second side of R2 is coupled to the control terminal of M1 and to the first side of R3. The second side of R3 is coupled to ground. As shown, the voltage source 702 is also coupled to a first current terminal (e.g., the source terminal) of M1. The second current terminal (e.g., the drain terminal) of M1 is coupled to an output 706 that provides an output voltage (VOUT). The output 706 may be coupled to a metal layer of a Bragg mirror as described herein. As shown, the second current terminal of M1 is also coupled to a first side of a resistor (R4) and a first side of a capacitor (C5), where C5 represents the equivalent Bragg mirror capacitance. The second side of R4 and the second side of C5 are coupled to ground.

In some example embodiments, the gain value (K) and/or the phase shift value (θ) provided by the VCVS 700 is adjustable. For example, the resistors R2, R3, or R4 may be trimmable to adjust the gain value and/or phase shift of the VCVS 700. As another option, the R2, R3, or R4 may be potentiometers having variable values based on one or more control signals. As another option, C4 may be a varactor having a variable value based on one or more control signals. By changing the gain and/or phase shift of the VCVS 700 (once or as needed), the parallel resonance frequency and/or parallel Q factor of a tunable BAW resonator is adjustable. Without limitation, the VCVS 700 may include one or more passive components (e.g., resistors, capacitors, inductors) having adjustable values to adjust the gain or phase shift of an amplifier circuit. The passive components may be selected from the list of passive components including trimmable resistors, trimmable inductors, and trimmable capacitors. As another option, a controller (e.g., the controller 304 in FIGS. 3A-3C) may provide control signal(s) to adjust the gain and/or phase shift of an amplifier circuit. For example, VCVS 700 may include one or more components (e.g., variable resistors, variable capacitors, variable inductors) whose values are adjustable based on the control signal(s)

With BAW resonator tunability based on application of an RF signal to the metal layer of a Bragg mirror, fine tuning is possible as well as a large shift (e.g., up to 8,000 ppm). The tuning options described herein offer a larger shift than other tuning options (e.g., application of a DC voltage to one of the electrodes of the BAW resonator core) without the cost of an external capacitor across the electrodes of the BAW resonator core.

The VCVS 700 is just one example of a VCVS. Other VCVS topologies and amplifier circuit topologies are possible. For example, another amplifier option is a multi-stage amplifier including a differential amplifier having: a high input impedance; an RC phase shifter; and a super source follower to strengthen the output drive.

In some example embodiments, the VCVS 700 enables course gain adjustments (e.g., on the order of 0.1V/V), fine gain adjustments (e.g., on the order of 0.001V/V), or both. Adjustments to the gain of an amplifier circuit may be selected to change the parallel resonance frequency of the tunable BAW resonator based on a target resonance frequency. Additionally or alternatively, adjustments to the phase shift of an amplifier circuit may be selected to the change the parallel Q factor of the tunable BAW resonator based on a target parallel resonance frequency.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "electrode", "node", "interconnection", "pin", "contact", and "connection" are used interchangeably. Unless specifically stated to the contrary, these terms are generally used to mean an interconnection between or a terminus of a device element, a circuit element, an integrated circuit, a device or other electronics or semiconductor component.

While the example embodiments above utilize pMOS transistors, other example embodiments may utilize nMOS transistors, NPN bipolar junction transistors (BJTs), PNP BJTs, or any other type of transistor. Hence, when referring to a current electrode, such electrode may be an emitter, collector, source or drain. Also, the control electrode may be a base or a gate.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims. For example, it should be appreciated that the BAW resonator tuning options described herein may be used individually or together as desired.

What is claimed is:

1. A tunable bulk acoustic wave (BAW) resonator comprising:
    a first electrode;
    a second electrode;
    a piezoelectric layer between the first electrode and the second electrode; and
    a Bragg mirror having:
        a metal layer; and
        a dielectric layer between the metal layer and either of the first electrode or the second electrode;
    a radio-frequency (RF) signal source having a first end and a second end, the first end coupled to the first electrode, and the second end coupled to the second electrode; and
    an amplifier circuit between the Bragg mirror metal layer and either the first electrode or the second electrode.

2. The tunable BAW resonator of claim 1, wherein the amplifier circuit is configured to apply a phase shift having an adjustable value from 0 to 180 degrees.

3. The tunable BAW resonator of claim 1, wherein the amplifier circuit is configured to apply an adjustable gain.

4. The tunable BAW resonator of claim 3, wherein the amplifier circuit includes a voltage-controlled voltage source that enables the gain of the amplifier circuit to be adjustable.

5. The tunable BAW resonator of claim 4, wherein the voltage-controlled voltage source includes one or more passive components having adjustable values.

6. The tunable BAW resonator of claim 5, wherein the passive components include trimmable resistors, trimmable inductors, and trimmable capacitors.

7. The tunable BAW resonator of claim 4, wherein the tunable BAW resonator comprises a controller configured to provide a control signal, and the voltage-controlled voltage source includes one or more components whose values are adjustable based on the control signal.

8. The tunable BAW resonator of claim 1, wherein the Bragg mirror is a first Bragg mirror, the metal layer is a first metal layer, the dielectric layer is a first dielectric layer between the first metal layer and the first electrode, the amplifier circuit is a first amplifier circuit between the first electrode and the first metal layer, and the tunable BAW resonator further includes a second Bragg mirror having:
   a second metal layer; and
   a second dielectric layer between the second metal layer and the second electrode.

9. The tunable BAW resonator of claim 8, wherein the tunable BAW resonator further includes a second amplifier circuit between the second electrode and the second metal layer.

10. The tunable BAW resonator of claim 1, wherein either the first electrode or the second electrode is grounded.

11. A system comprising:
   a tunable bulk acoustic wave (BAW) resonator having:
      a first electrode;
      a second electrode; and
      a piezoelectric layer between the first electrode and the second electrode;
   a Bragg mirror having:
      a metal layer; and
      a dielectric layer between the metal layer and either the first electrode or the second electrode; and
   an oscillator circuit coupled to the first electrode and the second electrode, wherein the tunable BAW resonator is configured to apply a radio-frequency (RF) signal to the metal layer of the Bragg mirror.

12. The system of claim 11, wherein the tunable BAW resonator is configured to apply a radio-frequency (RF) signal to the metal layer of the Bragg mirror to vary a parallel resonance of the tunable BAW resonator.

13. The system of claim 11, wherein the tunable BAW resonator is configured to apply a radio-frequency (RF) signal to the metal layer of the Bragg mirror to vary a parallel Q factor of the tunable BAW resonator.

14. The system of claim 11, wherein the tunable BAW resonator includes an amplifier circuit configured to apply an adjustable gain is to the RF signal based on a target parallel resonance frequency.

15. The system of claim 11, wherein the tunable BAW resonator includes an amplifier circuit configured to apply an adjustable phase shift to the RF signal based on a target parallel quality factor.

16. The system of claim 11, further comprising:
   a timing circuit coupled to the oscillator circuit and configured to provide a clock signal; and
   a component coupled to the timing circuit and configured to receive a clock signal.

17. An integrated circuit comprising:
   a bulk acoustic wave (BAW) resonator core, the BAW resonator core having a first electrode, a second electrode, and piezoelectric layer between the first electrode and the second electrode;
   a Bragg mirror adjacent to the BAW resonator core, the Bragg mirror having a metal layer;
   a radio-frequency (RF) signal source configured to apply an RF signal to the metal layer of the Bragg mirror; and
   an amplifier circuit between the RF signal source and the metal layer and configured to modify the RF signal.

18. The integrated circuit of claim 17, wherein the amplifier circuit is configured to apply an adjustable gain and an adjustable phase shift to the RF signal.

19. The integrated circuit of claim 18, wherein the amplifier circuit includes a voltage-controlled voltage source configured to apply the adjustable gain and the adjustable phase shift to the RF signal.

20. The integrated circuit of claim 17, wherein the Bragg mirror is a first Bragg mirror, the metal layer is a first metal layer, the RF signal is a first RF signal, the amplifier circuit is a first amplifier circuit, and the integrated circuit further comprises:
   a second Bragg mirror adjacent to the BAW resonator core and having a second metal layer, wherein the RF signal source is configured to apply a second RF signal to the second metal layer of the Bragg mirror; and
   a second amplifier circuit configured to modify the second RF signal.

* * * * *